(12) United States Patent
Liu et al.

(10) Patent No.: US 8,933,727 B1
(45) Date of Patent: Jan. 13, 2015

(54) MONOLITHIC TRANSMIT/RECEIVE MODULE DRIVER

(75) Inventors: Chengxin Liu, Bedford, MA (US); Christopher D. Weigand, Andover, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 245 days.

(21) Appl. No.: 13/592,816

(22) Filed: Aug. 23, 2012

(51) Int. Cl.
*H03K 19/0175* (2006.01)

(52) U.S. Cl.
USPC ............... 326/82; 326/83; 326/86; 710/302

(58) Field of Classification Search
None
See application file for complete search history.

(56) References Cited

U.S. PATENT DOCUMENTS

| | | | |
|---|---|---|---|
| 5,995,062 A | 11/1999 | Denney et al. | 343/853 |
| 6,510,487 B1 * | 1/2003 | Raza et al. | 711/100 |
| 7,321,651 B2 * | 1/2008 | Boerstler et al. | 377/30 |
| 7,728,771 B2 | 6/2010 | Lee et al. | 342/368 |

* cited by examiner

*Primary Examiner* — Jany Richardson
(74) *Attorney, Agent, or Firm* — Christopher P. Maiorana, PC

(57) ABSTRACT

An integrated circuit comprising a first circuit and a second circuit. The first circuit may be configured to generate a plurality of complementary outputs based upon a plurality of inputs, a first control signal, and a second control signal. The plurality of inputs may be received in parallel in a first mode and as a serial bit stream in a second mode. The second circuit may be configured to generate a plurality of outputs in response to a third control signal and a fourth control signal.

21 Claims, 6 Drawing Sheets

US 8,933,727 B1

MONOLITHIC TRANSMIT/RECEIVE MODULE DRIVER

FIELD OF THE INVENTION

The present invention relates to radar systems generally and, more particularly, to a method and/or apparatus for implementing a monolithic transmit/receive (T/R) module driver.

BACKGROUND OF THE INVENTION

Transmit/receive (T/R) modules are often used in radar arrays. Typical T/R modules can include power amplifier (PA) stages, low noise amplifier (LNA) stages, digital phase shifters, digital attenuators and T/R switches for interconnecting various components depending on whether the T/R module is in a transmit or a receive mode. Driving conventional T/R modules takes multiple drivers and discrete components.

It would be desirable to implement a monolithic T/R module driver that can both drive the numerous switches, phase shifters and attenuators and also enable and disable receive and transmit amplifiers to reduce power dissipation.

SUMMARY OF THE INVENTION

The present invention concerns an integrated circuit comprising a first circuit and a second circuit. The first circuit may be configured to generate a plurality of complementary outputs based upon a plurality of inputs, a first control signal, and a second control signal. The plurality of inputs may be received in parallel in a first mode and as a serial bit stream in a second mode. The second circuit may be configured to generate a plurality of outputs in response to a third control signal and a fourth control signal.

The objects, features and advantages of the present invention include providing a monolithic transmit/receive (T/R) module driver that may (i) reduce the number of drive signals, (ii) reduce the number of package pins needed, (iii) provide separate control of multiple amplifier stages to reduce potential feedback, and/or (iv) control transmitter and receiver amplifiers based on operating mode.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
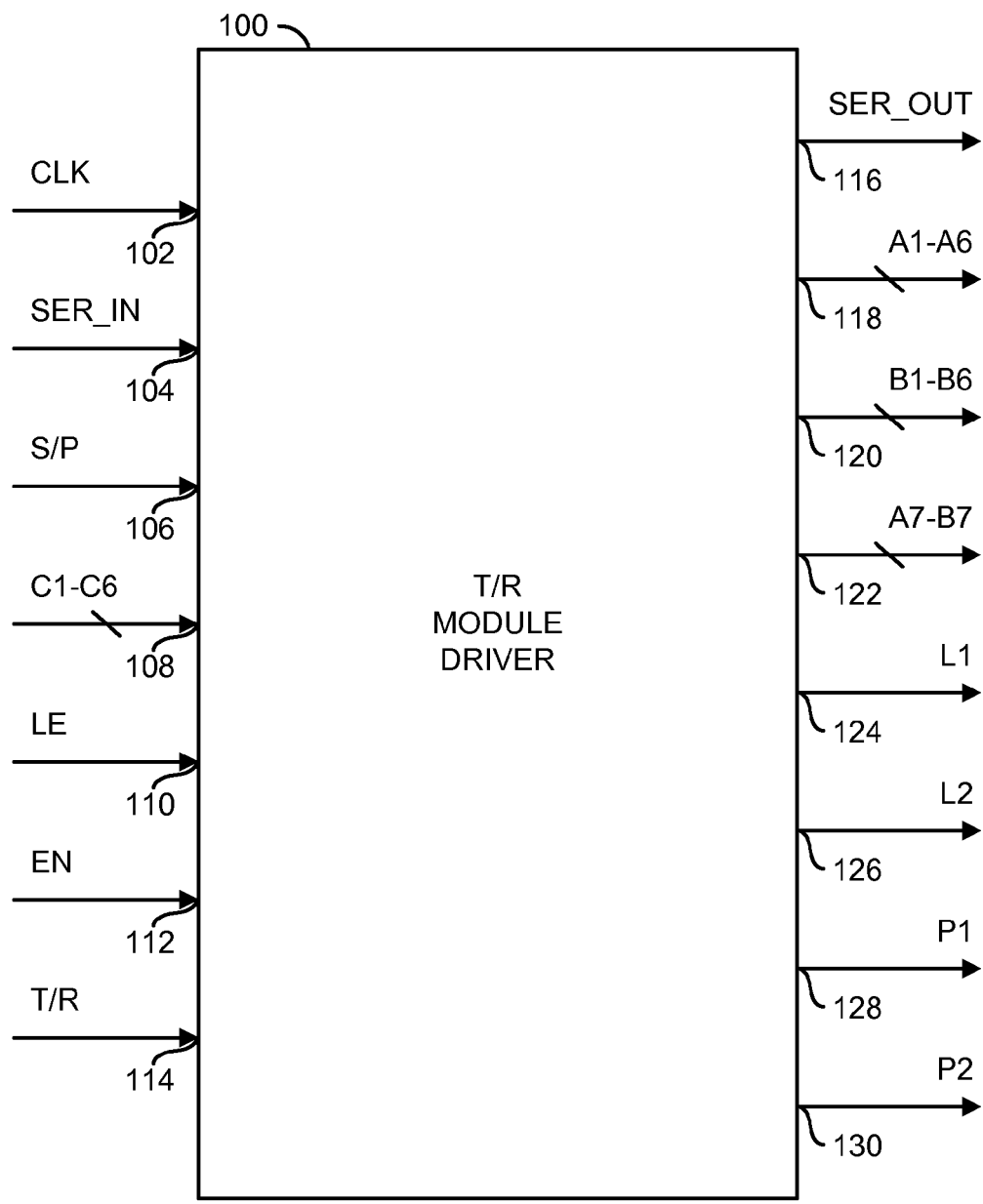
FIG. 1 is a diagram illustrating a transmit/receive module driver in accordance with an embodiment of the present invention.

Referring to FIG. 1, a diagram is shown illustrating a circuit 100 in accordance with an embodiment of the present invention. In one example, the circuit 100 may implement a transmit/receive module driver. The circuit 100 may, in one example, be implemented as a dedicated complimentary metal oxide semiconductor (CMOS) driver for multifunction modules such as GaAs based transmit/receive modules. The circuit 100 may be implemented on a monolithic integrated circuit (IC). In one example, the circuit 100 may be configured to accept transmit/receive and enable inputs, and translate the transmit/receive and enable inputs to control transmit/receive (T/R) switches in a transmit/receive (T/R) module and enable/disable transmit and receive amplifiers either separately or shutting off both transmit and receive amplifiers in a power conservation state. The circuit 100 may include a serial/parallel interface. In one example, a 6-bit serial/parallel interface may be implemented. However, other numbers of bits may be implemented accordingly to meet the design criteria of a particular implementation. The serial/parallel interface may be configured to drive digital attenuators and/or phase shifters. The circuit 100 may also include functionality to switch between transmit and receive channels and to enable/disable LNAs and/or PAs. In one example, high speed analog CMOS technology may be utilized in implementing the transmit/receive module driver 100 to achieve low power consumption at moderate to high speeds.

In one example, the T/R module driver 100 may include an input 102, an input 104, an input 106, an input 108, an input 110, an input 112, an input 114, an output 116, an output 118, an output 120, an output 122, an output 124, an output 126, an output 128 and an output 130. The input 102 may receive a clock signal (e.g., CLK). The input 104 may receive a serial data stream (e.g., SER_IN). The input 106 may receive a signal (e.g., S/P). The signal S/P may implement a control signal for switching between a serial and parallel operating mode. The input 108 may provide a number (e.g., 6) of parallel inputs for receiving a number of input bits (e.g., C1-C6). The input 110 may receive a signal (e.g., LE). The signal LE may implement a control signal that may be used to latch input data in the circuit 100. The input 112 may receive a signal (e.g., EN). The signal EN may be implemented as a control signal that may be used to enable/disable circuitry attached to the circuit 100. The input 114 may receive a signal (e.g., T/R). The signal T/R may be implemented as a control signal for switching between a transmit and a receive mode. In one example, the signals EN and T/R may be used to control logic configured to enable/disable low noise amplifiers (LNAs) and power amplifiers (PAs) attached to the circuit 100.

The output 116 may present a serial output data stream (e.g., SER_OUT). The output 118 may present a first set of parallel outputs (e.g., A1-A6). The output 120 may present a second set of parallel outputs (e.g., B1-B6). In one example, the outputs B1-B6 may be complementary to the outputs A1-A6. The output 122 may present a pair of complementary signals (e.g., A7 and B7). The output 124 may present a signal (e.g., L1). The output 126 may present a signal (e.g., L2). The output 128 may present a signal (e.g., P1). The output 130 may present a signal (e.g., P2). The signals L1, L2, P1 and P2 may be used, in one example, to control amplifiers in a T/R module being driven by the circuit 100. For example, the signals L1 and L2 may be used to control separate stages of a low noise amplifier (LNA) section. The signals P1 and P2 may be used to control separate stages of a power amplifier (PA) section. In one example, the use of multiple control signals to control multiple amplifier stages may reduce the possibility of instability due to feedback between the amplifier stages.

Figure 2:
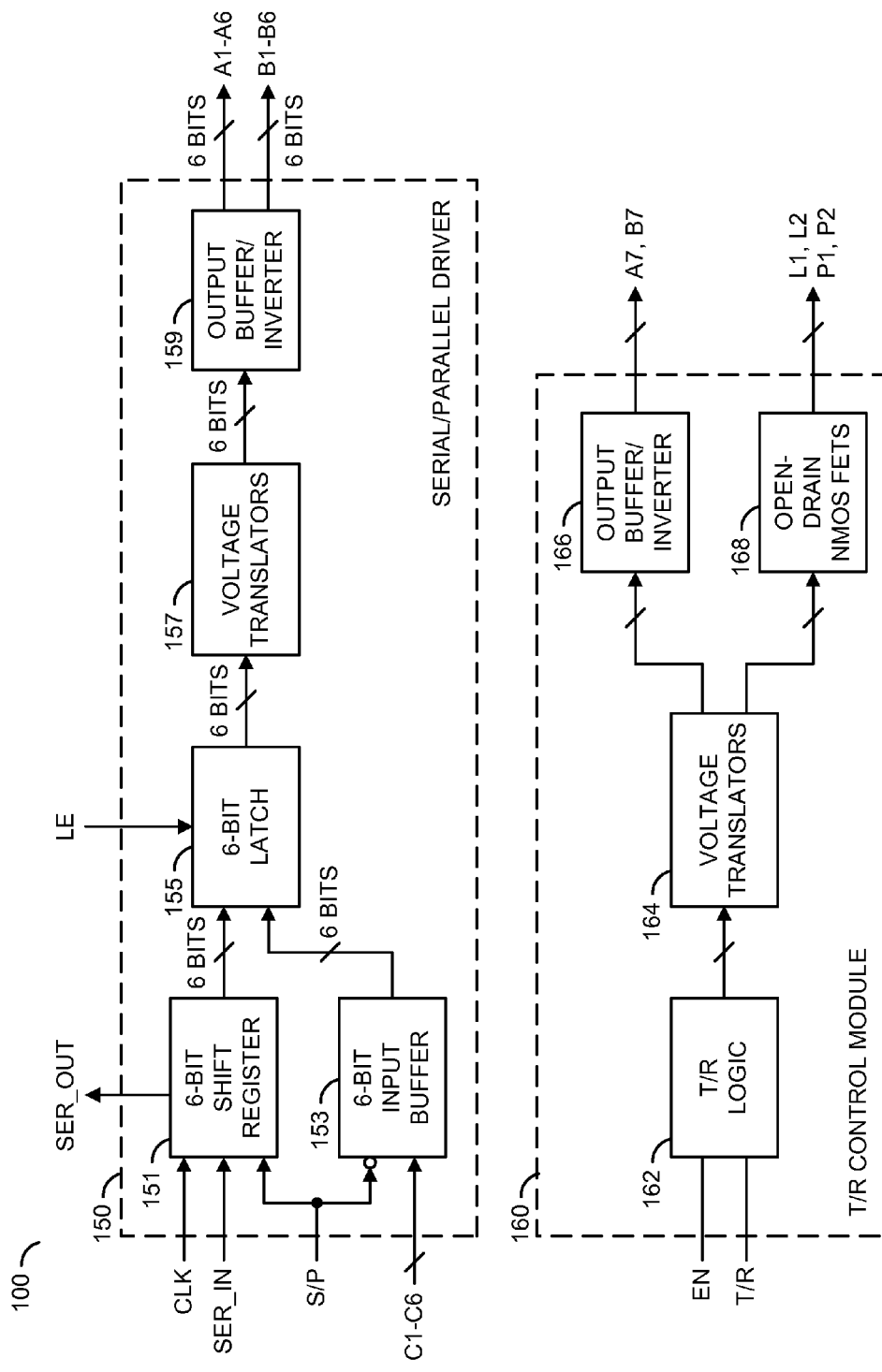
FIG. 2 is a block diagram illustrating an example implementation of a transmit/receive (T/R) module driver in accordance with an embodiment of the present invention.

Referring to FIG. 2, a block diagram is shown illustrating an example implementation of the circuit 100 of FIG. 1 in accordance with an embodiment of the present invention. In one example, the circuit 100 may comprise a block 150 and a block 160. The block 150 may implement a serial/parallel driver. The block 160 may implement a T/R control module. The serial/parallel driver 150 is generally implemented using the parallel input 108 (e.g., the signals C1-C6), the mode control input 106 (e.g., the signal S/P), the parallel output 118 (e.g., the in phase outputs A1-A6), the parallel output 120 (e.g., the complementary outputs B1-B6) and the serial output 116. A serial control interface is generally implemented with the input 102 (e.g., CLK), the input 104 (e.g., SER_IN), the input 110 (e.g., LE) and the serial output 116 (e.g., SER_OUT). In one example, the serial control interface may be compatible with SPI protocol.

The serial control interface may be activated when the signal S/P is maintained at an asserted level (e.g., set to a logic HIGH, or 1). In one example, when the serial control interface is activated, a serial word (e.g., 6 bits) may be loaded (e.g., MSB first) using the signal CLK. When the serial word has been loaded, the signal LE may be asserted (e.g., set to a logic HIGH, or 1) to latch (transfer) the data for presentation on the complementary outputs A1-A6 and B1-B6. When the signal LE is asserted, the signal CLK may be masked to prevent data transition during the data transfer. The signal SER_OUT generally comprises the signal SER_IN delayed by a number of clock cycles equivalent to the word size implemented (e.g., 6 clock cycles for a 6-bit word). The parallel mode is generally enabled when the signal S/P is maintained at a de-asserted level (e.g., set to a logic LOW, or 0). In the parallel mode, the outputs A1-A6 and B1-B6 may be controlled by the parallel inputs C1-C6 directly.

The T/R control module is generally implemented using the input 112 (e.g., the signal EN), the input 114 (e.g., the signal T/R), and the outputs 122-130 (e.g., the signals A7, B7, L1, L2, P1, P2). The output signals A7 and B7 are generally configured to drive switches in a multi-function module connected to the circuit 100. For example, the signals A7 and B7 may be used to control single-pole double-throw (SPDT) T/R switches in a T/R module in order to switch between transmit and receive modes. The T/R control module may be further configured to use a combination of the input signals EN and T/R to implement power consumption control. For example, the T/R control module may control the output signals L1, L2, P1 and P2 based upon the combination of the input signals EN and T/R. The output signals L1, L2, P1 and P2 may then be utilized to turn on/off subsequent circuitry. For example, the signals L1, L2, P1 and P2 may be configured to turn on/off receive path LNAs and transmit path PAs in a T/R module. In one example, the signals L1, L2, P1 and P2 may be implemented with open-drain NMOS FETs. When the NMOS FETs are turned on, the NMOS FETs may pull down a gate of GaAs FETs in the amplifiers to shut the amplifiers down. In another example, the signals L1, L2, P1 and P2 may be used to control up to four LNA stages and four PA stages. In one example, the T/R control module 160 may include logic and/or a look-up table (LUT) implementing the following TABLE 1:

TABLE 1

| Inputs | | Outputs | | | |
|---|---|---|---|---|---|
| EN | T/R | A7 | B7 | L1, L2 | P1, P2 |
| 0 | 1 | GND | VEE | Hi-Z | Hi-Z |
| 0 | 0 | VEE | GND | Hi-Z | Hi-Z |
| 1 | 1 | GND | VEE | Hi-Z | LOW |
| 1 | 0 | VEE | GND | LOW | Hi-Z |

The LOW state shown in the TABLE 1 generally refers to the NMOS FET being on (e.g., pulling the associated output to approximately VEE+0.1V). The Hi-Z state in the TABLE 1 generally refers to the open-drain FET being shut off and presenting a high impedance.

The block 150 may comprise a block 151, a block 153, a block 155, a block 157, a block 159. The block 160 may comprise a block 162, a block 164, a block 166 and a block 168. The block 151 may be implemented, in one example, as a 6-bit shift register. The block 153 may be implemented, in one example, as a 6-bit input buffer. The block 155 may be implemented, in one example, as a G-bit latch. The block 157 may be implemented, in one example, as a voltage translator. The block 159 may be implemented, in one example, as an output buffer/inverter block. The block 162 may be implemented as a control logic. The block 164 may be implemented, in one example, as voltage translators. The block 166 may be implemented, in one example, as output buffers/inverters. The block 168 may be implemented, in one example, as a number of open drain NMOS field effect transistors.

The block 151 may have a first input that may receive the signals CLK, a second input that may receive the signal SER_IN, a third input that may receive the signal S/P and a first output that may present the signal SER_OUT and a second output that may present parallel signals to a first input of the block 155. The block 153 may have a first input that may receive the signals C1-C6 and a second input that may receive the signal S/P. The block 153 may have an output that may present a number of bits to a second input of the block 155. The block 155 may have a third input that may receive the signal LE and an output that may present a number of bits to an input of the block 157. The block 157 may have an output that may present a number of signals to an input of the block 159. The block 159 may have a number of first outputs that may present the signals A1-A6 and a number of second outputs that may present the signals B1-B6.

The block 162 may have a first input that may receive the signal EN and a second input that may receive the signal T/R. An output of the block 162 may be presented to an input of the block 164. In one example, the block 152 may implement logic and/or a look-up table embodying the truth table of TABLE 1 above. The block 164 may have a first output that may present a number of signals to an input of the block 166 and a second output that may present a number of signals to an input of the block 168. The block 166 may have a number of outputs that may present the signals A7 and B7. The block 168 may have a number of outputs that may present the signals L1, L2, P1 and P2.

Figure 3:
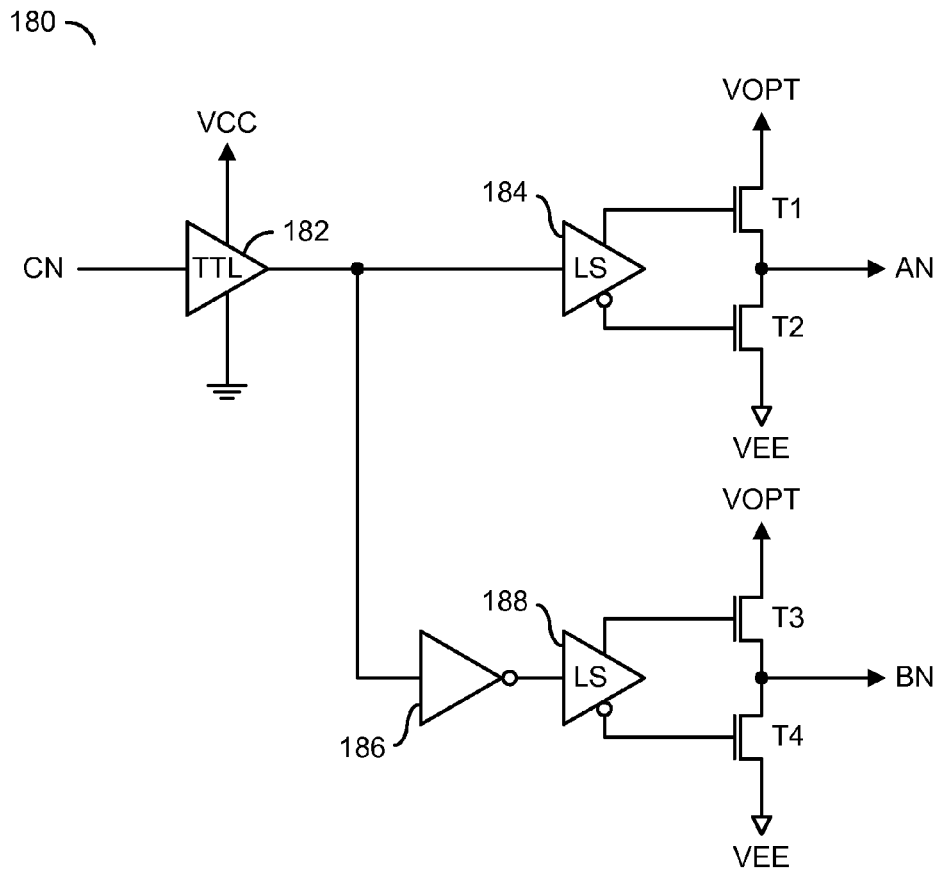
FIG. 3 is a diagram illustrating a functional schematic for one bit of a serial/parallel driver circuit of FIG. 2.

Referring to FIG. 3, a diagram of a circuit 180 is shown illustrating a 1-bit path of the serial/parallel driver circuit 150 of FIG. 2. The circuit 180 generally represents a function schematic of a pathway by which the serial/parallel driver circuit 150 of FIG. 2 generates the signals A1-A6 and B1-B6 in response to the signals C1-C6. The circuit 180 generally comprises a block 182, a block 184, a block 186, a block 188, and a number of transistors T1-T4. The block 182 generally represents TTL (transistor transistor logic) circuitry that may, in one example, be used to implement the blocks 151, 153 and 155. The blocks 184 and 188 generally represent the voltage translator module 157 of the serial/parallel driver circuit 150. The block 186 generally represents an inverter function that may be used to generate a complement of a signal. The transistors T1-T4 generally represent the output buffer/inverter block 159 of the serial parallel driver circuit 150.

In an example operation, an input signal (e.g., CN) is presented to an input of the TTL portion of the circuit 182. The TTL portion 182 generates an output that is presented to an input of the block 184 and an input of the block 186. The block 184 generally shifts the received signal to a voltage level appropriate for driving the transistors T1 and T2. The block 186 generally inverts (complements) the received signal and presents the complemented signal to an input of the block 188. The block 188 generally shifts the received signal to a voltage level appropriate for driving the transistors T3 and T4. The transistors T1 and T2 are generally configured to generate an output signal (e.g., AN) in response to a first supply voltage (e.g., VOPT) and a second supply voltage (e.g., VEE). The transistors T3 and T4 are configured to generate an output signal (e.g., BN) in response to the power supplies VOPT and VEE. The output signal AN generally tracks the input signal CN. The output BN is generally a complement of the input signal CN. Multiple instances of the circuit 180 may be implemented to generate the signals A1-A6 and B1-B6 in FIG. 2.

As illustrated by the circuit 180, the serial/parallel driver circuit 150 is generally configured to translate logic level (e.g., TTL, CMOS, LVCMOS, etc.) control inputs into negative gate control voltages for gallium arsenide (GaAs) FET microwave switches, phase shifters, and attenuators. In one example, the serial/parallel driver circuit 150 may be implemented using high speed analog CMOS technology to achieve low power dissipation at moderate to high speeds. The serial/parallel driver circuit 150 may be implemented to encompass most microwave switching applications. In one example, the signals A1-A7 and B1-B7 may be implemented with an output HIGH level in the range of 0-2 volts relative to ground (CND). The range of 0-2 volts relative to ground may optimize the intermodulation products of GaAs FET control devices at low frequencies. For driving higher power devices (e.g., PIN diode circuits), one or more of the outputs A1-A7 and B2-B7 may be switched between +5 and −5 volts. The voltage range implemented may be selected to meet the design criteria of a particular application. The actual driver output voltages may be lower when driving large currents due to resistance of the output devices (e.g., represented by the transistors T1-T4). In one example, the voltage supply VOPT may be grounded when FETs are driven. In another example, the supply voltage VOPT may be set between 1.0 and 2.0 volts to improve the intermodulation performance and the 1 dB compression point of GaAs control devices at low frequencies.

Figure 4:
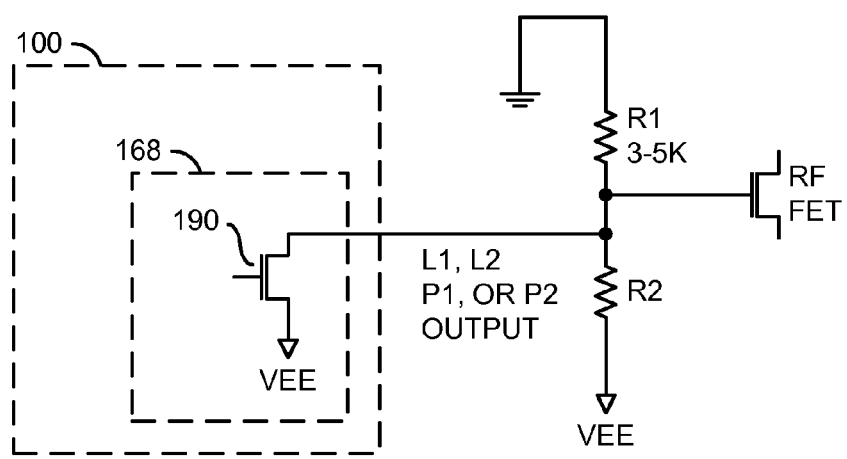
FIG. 4 is a diagram illustrating an application circuit for controlling a T/R amplifier utilizing an open-drain NMOS-FET output of the T/R module driver of FIG. 2.

Referring to FIG. 4, a diagram is shown illustrating an application circuit that may be implemented to control a T/R amplifier utilizing one of the open-drain NMOSFETs 168 of the T/R control module 160 of FIG. 2. The open-drain NMOSFETs of the module 168 generally provide the signals L1, L2, P1 and P2 presented at the outputs 124-130 of the T/R module driver 100. When the open-drain NMOSFETs 168 are turned on, the NMOSFETs may be used, for example, to pull down a gate voltage of a GaAs FET in an amplifier of a T/R module (or other device) attached to the T/R module driver 100 to pinch off the GaAs FET. In one example, each of the output signals L1, L2, P1 and/or P2 may be generated by a corresponding open-drain NMOSFET 190. In one example, the open-drain output may be connected to a voltage divider formed using a resistor R1 and a resistor R2 and connected between ground and a supply voltage (e.g., VEE). The voltage divider may be used to bias a gate of the GaAs FET in the device to be controlled when the open-drain NMOSFET 190 is not conducting (or turned off).

Figure 5:
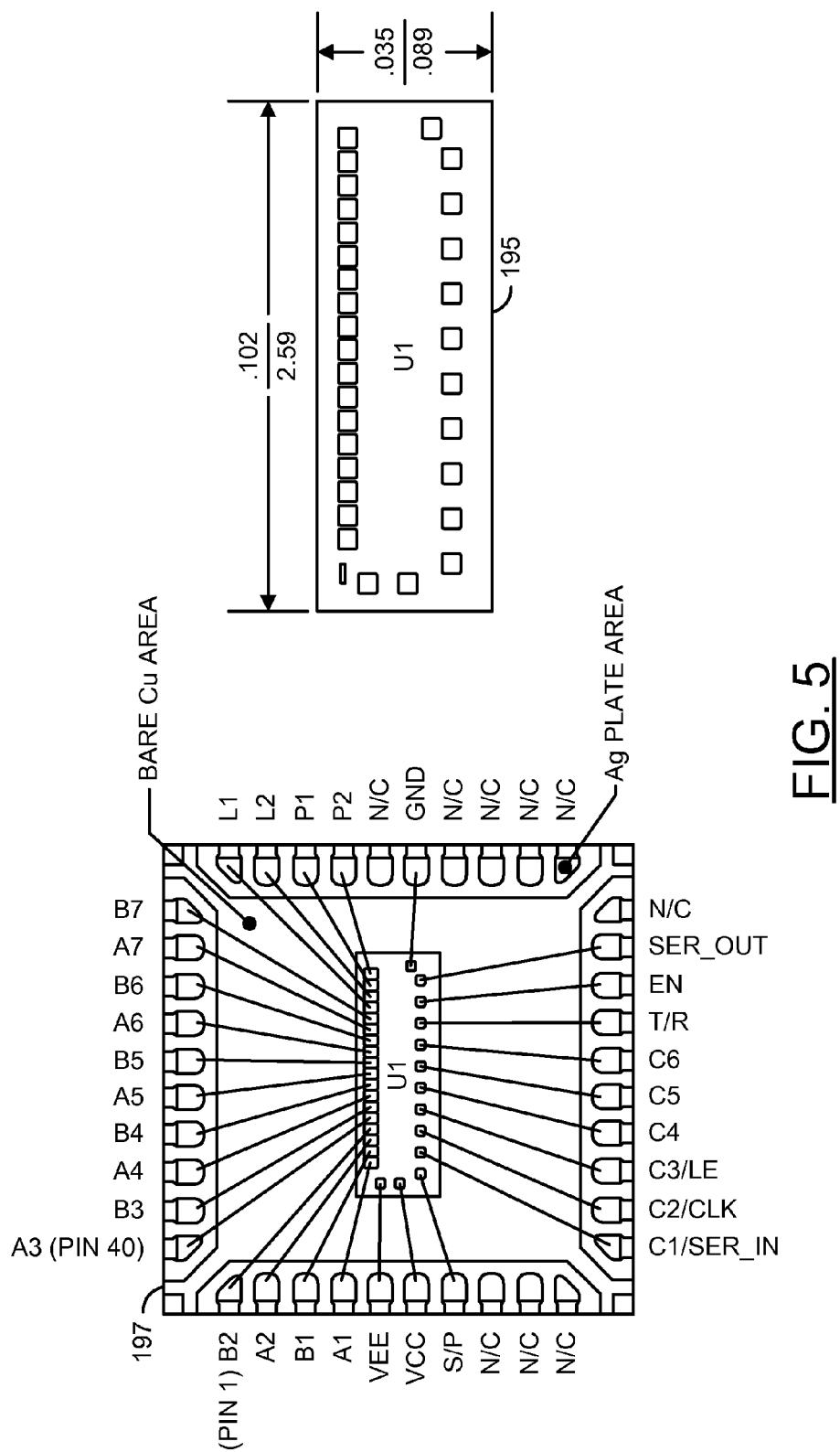
FIG. 5 is a diagram illustrating a package in which an integrated circuit implementing a T/R module driver in accordance with an embodiment of the present invention may be mounted.

Referring to FIG. 5, a diagram illustrating an integrated circuit implementing a T/R module driver in accordance with an embodiment of the present invention and a package in which the integrated circuit may be mounted are shown. In one example, the T/R module driver 100 may be implemented as a monolithic integrated circuit (UI) 195. In one example, the monolithic integrated circuit 195 may be packaged in a 5 mm PQFN-40LN lead-free plastic package. In one example, the serial interface signals may share pins used by the parallel interface signals. Sharing pins between the serial and parallel interfaces generally reduces the overall number of pins needed for the integrated circuit.

Figure 6:
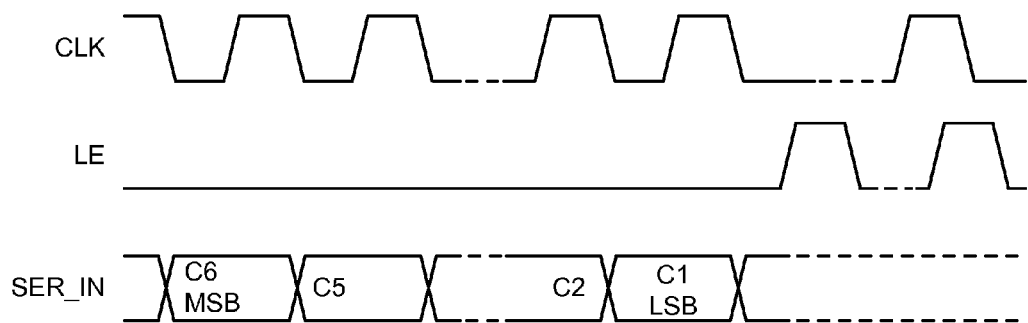
FIG. 6 is a timing diagram illustrating operation of a serial interface of a transmit/receive module driver in accordance with an embodiment of the present invention.

Referring to FIG. 6, a timing diagram is shown illustrating operation of a serial interface of the T/R module driver 100 of FIG. 1. The serial control interface may be activated when the signal S/P is maintained at an asserted level (e.g., set to a logic HIGH, or 1). In one example, when the serial control interface is activated, a serial word (e.g., 6 bits) may be loaded (e.g., MSB first) using the signal CLK. For example, data bits contained in the signal SER_IN may be sampled on a rising edge of the signal CLK. When the serial word has been loaded, the signal LE may be asserted (e.g., set to a logic HIGH, or 1) to latch (transfer) the data for presentation on the complementary outputs A1-A6 and B1-B6. When the signal LE is asserted, the signal CLK may be masked to prevent data transition during the data transfer. The signal SER_OUT generally comprises the signal SER_IN delayed by a number of clock cycles equivalent to the word size implemented (e.g., 6 clock cycles for a 6-bit word). The parallel mode is generally enabled when the signal S/P is maintained at a de-asserted level (e.g., set to a logic LOW, or 0). In the parallel mode, the outputs A1-A6 and B1-B6 may be controlled by the parallel inputs C1-C6 directly.

Figure 7:
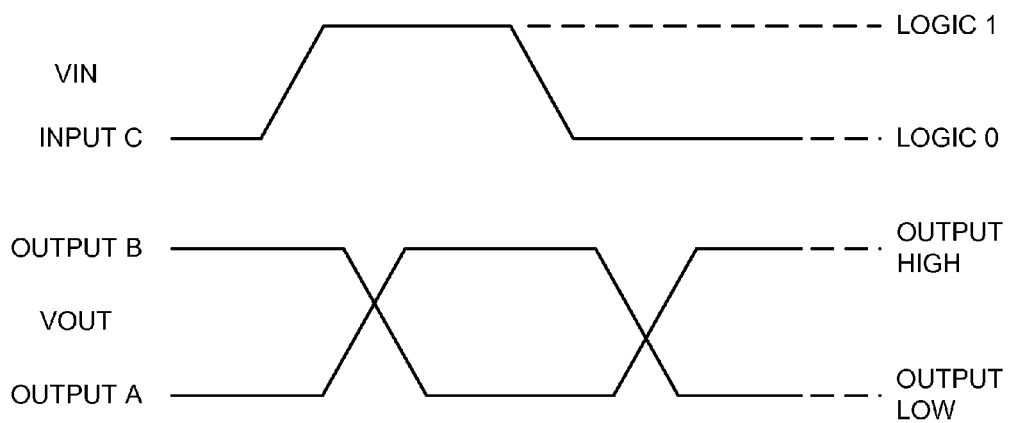
FIG. 7 is a timing diagram illustrating switching waveforms between an input interface and an output interface of a transmit/receive module driver in accordance with an embodiment the present invention.

Referring to FIG. 7, a timing diagram is shown illustrating switching relationships between the parallel input signals and the parallel output signals of the circuit 100 of FIG. 1. In one example, the input signals C1-C6 may swing between predefined logic levels (e.g., TTL, 3V, etc.). The output signals A1-A7 and B1-B7 may be configured to swing between a high output voltage level and a low output voltage level in response to the input signals. The output signals may swing between voltage levels other than the levels of the input signals. For example, the output signals A1-A7 and B1-B7 may swing between GND as the high output voltage level and VEE as the low output voltage level. However, other voltage levels may be implemented accordingly to meet the design criteria of a particular implementation.

Figure 8:
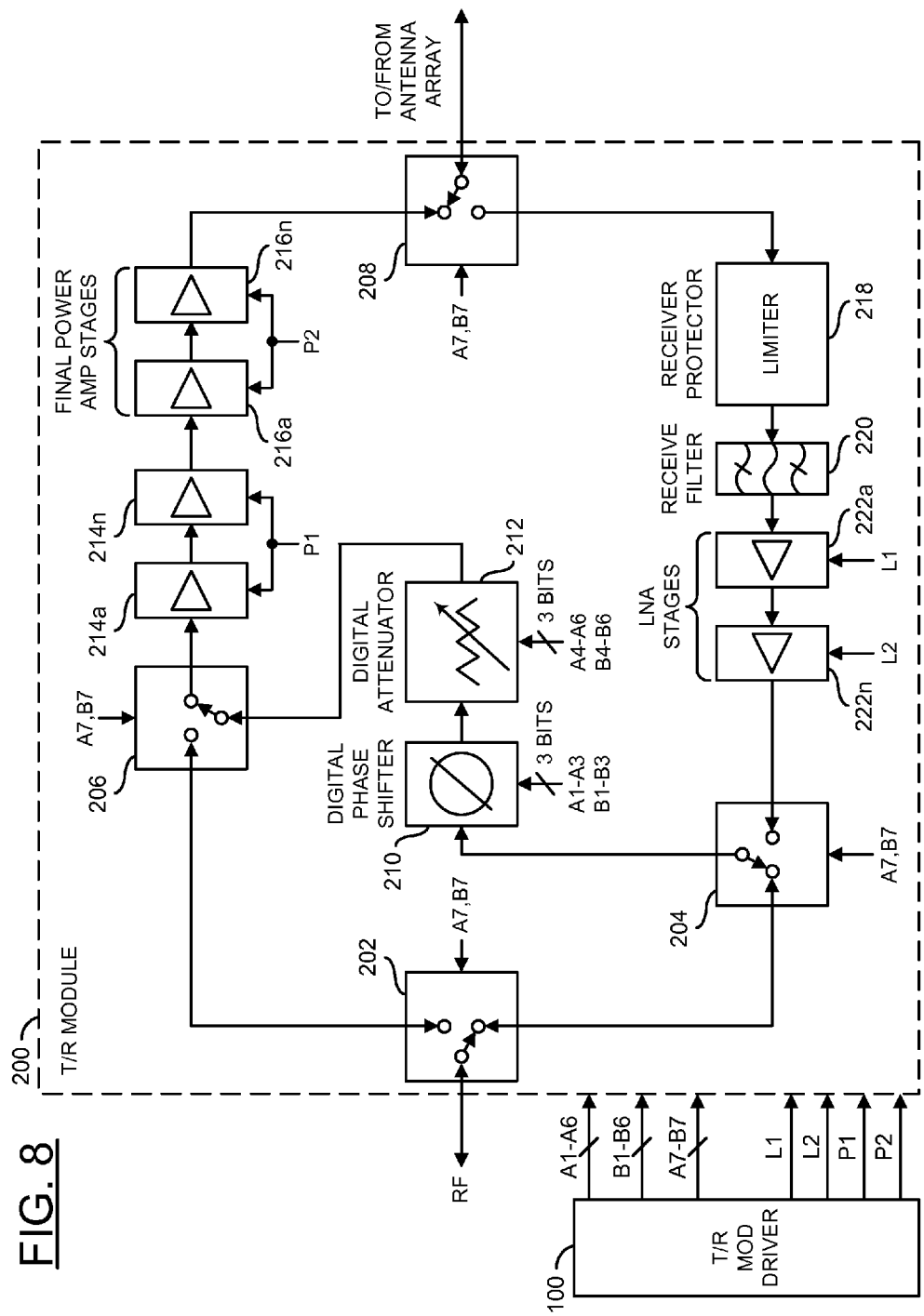
FIG. 8 is a diagram illustrating a transmit/receive module driver in accordance with a preferred embodiment of the present invention implemented in a radar system.

Referring to FIG. 8, a diagram is shown illustrating a context in which a T/R module driver in accordance with an embodiment of the present invention may be implemented. In one example, the T/R module driver 100 may be connected with a T/R module 200. In one example, the T/R module 200 may be part of a radar system. However, other RF transmit/receive systems (e.g., cellular phone system, WiFi, etc.) may be implemented accordingly. The T/R module 200 may comprise a module (or circuit) 202, a module (or circuit) 204, a module (or circuit) 206, a module (or circuit) 208, a module (or circuit) 210, a module (or circuit) 212, a number of modules (or circuits) 214a-214n, a number of modules (or circuits) 216a-216n, a module (or circuit) 218, a module (or circuit) 220, and a number of modules (or circuits) 222a-222n. The modules 202-208 may be implemented as transmit/receive (T/R) switches. The module 210 may be implemented as a digital phase shifter. The module 212 may be implemented as a digital attenuator. The modules 214a-214n may implement power amplifier (PA) stages of a transmit path of the T/R module 200. The modules 216a-216n may implement final power amplifier (PA) stages of the transmit path of the T/R module 200. The module 218 may implement a limiter configured to provide protection for a receiver path of the T/R module 200. The module 220 may implement a receive filter. The modules 222a-222n may implement low noise amplifier (LNA) stages of the receive path of the T/R module 200. The T/R module 200 may be configured to receive the signals A1-A7, B1-B7, L1, L2, P1, and P2 from the T/R module driver 100. In one example, the signals A7 and B7 may be used to control the T/R switch modules 202, 204, 206 and 208 to select between transmit and receive modes of the T/R module 200. Even though a unidirectional arrow is depicted in the T/R switch modules 202, 204, 206 and 208, signals may flow in either direction, as is required to transmit and receive.

The transmit path of the T/R module 200 generally begins at the T/R switch module 202. When the T/R switch modules 202, 204, 206, and 208 are set to the transmit mode by the signals A7 and B7, an RF signal may flow across the T/R switch module 202 from an RF input/output connection to the T/R switch module 204, and then to the module 210. The RF signal may be phase shifted by the module 210. In one example, the module 210 may implement a variable phase shifter. For example, the module 210 may be configured to implement a number of bits (e.g., 3) of phase shift. However, other numbers of bits may be implemented accordingly to meet the design criteria of a particular implementation. The amount of phase shift may be determined, in one example, using the signals A1-A3 and B1-B3. After the RF signal is phase shifted, the RF signal may be attenuated by the module 212. In one example, the module 212 may implement a variable resistance. For example, the module 212 may be configured to implement a number of bits (e.g., 3) of attenuation. The amount of attenuation may be determined, in one example, using the signals A4-A6 and B4-B6. However, other numbers of bits may be implemented accordingly to meet the design criteria of a particular implementation. The modules 210 and 212 may implement the same or a different number of bits. For example, fine grained phase shift and attenuation may be employed to make small adjustments to a shape of an RF signal transmitted by an antenna array connected to the T/R module 200.

After being shifted and attenuated, the RF signal may exit the module 212 and continue to the power amplifier (PA) stages 214a-214n and 216a-216n via the module 206. In one example, the transmit path of the T/R module 200 may have four gain stages. However, other numbers of gain stages may be implemented accordingly to ensure that the transmitted signal has the requisite signal strength. The power amplifier stage 216n outputs the amplified RF signal to the T/R switch module 208, where the amplified RF signal is routed to an antenna or antenna array connected to the T/R module 200. The T/R switch module 208 is generally implemented as a high power switch that connects the antenna or antenna array to either the transmit path or to the receive path of the T/R module 200 (e.g., generally determined by the signals A7 and B7). In one example, the T/R switch module 208 may be integrated with the final power amplifier stages 216a-216n.

The receive path of the T/R module 200 generally begins where the T/R switch module 208 connects to the lead from the antenna or antenna array. The receive path continues through the module 218 and the module 220 to the modules 222a-222n. The module 218 generally limits the received RF signal to protect the receiver circuitry. The module 220 generally provides filtering of the received RF signal. The modules 222a-222n generally provide a number of gain stages forming a low noise amplifier (LNA). A low noise amplifier (LNA) is generally used to amplify the RF signal received by the antenna array because these signals are often too weak to be directly fed into other circuit components. A LNA is a type of amplifier that is optimized to produce as little noise as possible while still meeting amplification requirements for the signal. An output of the module 222n flows across the T/R switch module 204 to the module 210. The modules 202, 204, 206, 210, and 212 generally perform the same function on the received signals as performed on the transmitted signals. In one example, a series of gain stages (not shown) may be implemented in conjunction with the modules 210 and 212. For example, gain stages may be implemented before, between and/or after the modules 210 and 212. The output of the module 212 may travel across the T/R switch module 206 to the T/R switch module 202, and then to the RF input/output connection of the T/R module 200.

The signals L1, L2, P1, and/or P2 may be used to reduce power dissipation of the T/R module 200 by disabling (e.g., shutting down) one or more of the power amplifier stages of the transmit path or the low noise amplifier stages of the receive path depending upon whether the T/R module is in the transmit or receive mode. For example, the signal P1 may be used to enable/disable the modules 214a-214n, the signal P2 may be used to enable/disable the modules 216a-216n, the signal L1 may be used to enable/disable the module 222a, and the signal L2 may be used to enable/disable the module 222n. The signals L1 and L2 may be configured to control the operation of the low noise amplifier (LNA) stages 222a-222n in the receive path to reduce power dissipation during operation of the T/R module 200 in the transmit mode. The signals P1 and P2 may be configured to control operation of the power amplifier (PA) stages 214a-214n and 216a-216n in the transmit path to reduce power dissipation during operation of the T/R module 200 in the receive mode. By splitting the power and low noise amplifiers into stages and controlling the stages by separate signals, feedback paths may be eliminated that could lead to instability. For example, there would be a risk of feedback through the L1 control circuit causing oscillations if too many stages are controlled by the came control line.

Embodiments of the present invention may be used to implement transmit/receive (T/R) module drivers that may be used to drive conventional T/R modules as well as transmit/receive functions built with discrete devices. For example, embodiments of the present invention may be used to implement transmit/receive (T/R) module drivers configured to control various switches, phase shifters, attenuators, amplifiers (or gain stages), etc. of various transmit/receive systems. For example, the signals A1-A6 and/or the signals B1-B6 may be used to program sub-modules (e.g., phase shifters, attenuators, switches, etc.) of the transmit/receive systems. The signals L1, L2, P1 and/or P2 may be used to control the power to various sub-modules (e.g., amplifiers, etc.) of the transmit/receive systems. The signals A7 and B7 may be used to control transmit/receive switches of the transmit/receive systems. Additional signals may be implemented accordingly to meet the design criteria of a particular implementation.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An integrated circuit comprising:
a first circuit configured to generate a plurality of complementary outputs based upon a plurality of inputs, a first control signal, and a second control signal, wherein the plurality of inputs can be received in parallel in a first mode and as a serial bit stream in a second mode; and
a second circuit configured to generate a plurality of outputs in response to a third control signal and a fourth control signal, wherein said second circuit comprises an output buffer circuit configured to generate two of said plurality of outputs as complementary signals and a number of open-drain transistors configured to present the remainder of the plurality of outputs.

2. The integrated circuit according to claim 1, wherein said first circuit comprises a serial/parallel driver and said second circuit comprises a transmit/receive control module.

3. The integrated circuit according to claim 1, wherein said number of open-drain transistors comprise NMOS field effect transistors.

4. The integrated circuit according to claim 1, wherein said second circuit further comprises a number of voltage translators configured to generate inputs to said output buffer circuit and said number of open-drain transistors in response to a number of input signals.

5. The integrated circuit according to claim 4, wherein said second circuit further comprises a transmit/receive logic circuit configured to generate the input signals to said voltage translators in response to said third and said fourth control signals.

6. The integrated circuit according to claim 5, wherein said transmit/receive logic circuit comprises a look up table defining relationships between said plurality of outputs and said third and said fourth control signals.

7. The integrated circuit according to claim 1, wherein said first circuit comprises:
an output buffer circuit configured to generate said plurality of complementary outputs based upon a number of parallel input signals;
a data latch configured to latch said number of parallel input signals in response to said second control signal; and
a voltage translator circuit configured to translate a voltage level of the number of parallel input signals between a supply voltage of said data latch and a supply voltage of said output buffer circuit.

8. The integrated circuit according to claim 1, wherein said integrated circuit is configured to control a transmit/receive (T/R) module.

9. The integrated circuit according to claim 8, wherein said transmit/receive module is part of a radar system.

10. The integrated circuit according to claim 1, wherein said integrated circuit comprises a complimentary metal oxide semiconductor (CMOS) integrated circuit.

11. The integrated circuit according to claim 1, wherein said integrated circuit is part of a radio frequency (RF) transmit/receive system.

12. A method of driving a transmit/receive module comprising the steps of:

generating a plurality of complementary outputs based upon a plurality of inputs, a first control signal, and a second control signal, wherein the plurality of inputs can be received in parallel in a first mode and as a serial bit stream in a second mode; and
generating a plurality of outputs in response to a third control signal and a fourth control signal, wherein two of said plurality of outputs are generated as complementary signals and a remainder of the plurality of outputs are generated using a number of open-drain transistors.

13. The method according to claim 12, further comprising:
controlling one or more digital phase shifters with said plurality of complementary outputs.

14. The method according to claim 12, further comprising:
controlling one or more digital attenuators with said plurality of complementary outputs.

15. The method according to claim 12, further comprising:
controlling one or more digital phase shifters and one or more digital attenuators with said plurality of complementary outputs.

16. The method according to claim 12, further comprising:
controlling one or more transmit/receive (T/R) switches with said plurality of outputs.

17. The method according to claim 12, further comprising:
controlling one or more power amplifiers in a transmit path and one or more low noise amplifiers in a receive path in response to said third control signal and said fourth control signal.

18. The method according to claim 12, further comprising:
separately controlling two or more power amplifier stages in a transmit path in response to said third control signal and said fourth control signal; and
separately controlling two or more low noise amplifier stages in a receive path in response to said third control signal and said fourth control signal.

19. The method according to claim 18, further comprising:
controlling one or more transmit/receive switches in response to one or more of said third and said fourth control signals.

20. The method according to claim 12, further comprising simultaneously controlling (i) one or more transmit/receive switches, (ii) one or more power amplifiers in a transmit path and (iii) one or more low noise amplifiers in a receive path based upon a logical combination of said third and said fourth control signals.

21. An integrated circuit comprising:
a first circuit configured to generate a plurality of complementary outputs based upon a plurality of inputs, a first control signal, and a second control signal, wherein the plurality of inputs can be received in parallel in a first mode and as a serial bit stream in a second mode, and said first circuit comprises an output buffer circuit configured to generate said plurality of complementary outputs based upon a number of parallel input signals, a data latch configured to latch said number of parallel input signals in response to said second control signal, and a voltage translator circuit configured to translate a voltage level of the number of parallel input signals between a supply voltage of said data latch and a supply voltage of said output buffer circuit; and
a second circuit configured to generate a plurality of outputs in response to a third control signal and a fourth control signal.

* * * * *